US010840069B2

(12) United States Patent
Tobe et al.

(10) Patent No.: US 10,840,069 B2
(45) Date of Patent: Nov. 17, 2020

(54) PLASMA PROCESSING APPARATUS AND PLASMA CONTROL METHOD

(71) Applicant: TOKYO ELECTRON LIMITED, Tokyo (JP)

(72) Inventors: Yasuhiro Tobe, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 173 days.

(21) Appl. No.: 15/997,776

(22) Filed: Jun. 5, 2018

(65) Prior Publication Data

US 2018/0350566 A1 Dec. 6, 2018

(30) Foreign Application Priority Data

Jun. 6, 2017 (JP) ................................ 2017-111552

(51) Int. Cl.
*B23K 10/00* (2006.01)
*H01J 37/32* (2006.01)

(52) U.S. Cl.
CPC . *H01J 37/32642* (2013.01); *H01J 2237/2001* (2013.01)

(58) Field of Classification Search
CPC ........ H01J 37/32643; H01J 2237/2001; H05B 1/02; H05B 1/34; H05B 1/30; H05B 1/36; H05B 1/46
USPC ......... 219/121.43, 121.54; 118/723 I, 723 E, 118/723 R, 723 FI; 156/345.43, 345.47, 156/345.48
See application file for complete search history.

(56) References Cited

U.S. PATENT DOCUMENTS

| | | | | |
|---|---|---|---|---|
| 10,217,611 | B2 * | 2/2019 | Aramaki | H01J 37/32183 |
| 2005/0103275 | A1 * | 5/2005 | Sasaki | H01J 37/32642 118/728 |
| 2010/0243620 | A1 * | 9/2010 | Yamawaku | H01J 37/32623 219/121.54 |
| 2014/0110061 | A1 * | 4/2014 | Okunishi | H05H 1/46 156/345.52 |
| 2016/0141154 | A1 * | 5/2016 | Kamata | G01B 7/023 324/671 |
| 2016/0351378 | A1 * | 12/2016 | Kishi | H01J 37/32642 |
| 2018/0233328 | A1 * | 8/2018 | Ueda | H01J 37/32807 |
| 2018/0301322 | A1 * | 10/2018 | Sugita | H01L 21/67742 |

FOREIGN PATENT DOCUMENTS

JP 2010-232476 A 10/2010

* cited by examiner

*Primary Examiner* — Mark H Paschall
(74) *Attorney, Agent, or Firm* — Rothwell, Figg, Ernst & Manbeck, P.C.

(57) ABSTRACT

A plasma processing apparatus includes a mounting table, a power supply unit and a power supply control unit. The mounting table has therein a coil provided along a mounting surface on which a focus ring is mounted. The power supply unit is configured to apply a high frequency voltage to the coil. The power supply control unit is configured to control the power supply unit to increase a power of the high frequency voltage applied to the coil in accordance with consumption of the focus ring.

17 Claims, 13 Drawing Sheets

START

S10
READ OUT THE NUMBER OF EXECUTION OF PLASMA PROCESSING OR CUMULATIVE PROCESSING TIME OF PLASMA PROCESSING

S11
READ OUT POWER AMOUNT OF HIGH FREQUENCY POWER

S12
CONTROL THIRD RF POWER SUPPLY TO SUPPLY HIGH FREQUENCY POWER OF THE READ-OUT POWER AMOUNT

S13
MEASURE AND STORE THE NUMBER OF EXECUTION OF PLASMA PROCESSING OR CUMULATIVE PROCESSING TIME OF PLASMA PROCESSING

END

PLASMA PROCESSING APPARATUS AND PLASMA CONTROL METHOD

CROSS-REFERENCE TO RELATED APPLICATIONS

This application claims priority to Japanese Patent Application No. 2017-111552 filed on Jun. 6, 2017, the entire contents of which are incorporated herein by reference.

FIELD OF THE INVENTION

The present disclosure relates to a plasma processing apparatus, plasma control method and a plasma control program.

BACKGROUND OF THE INVENTION

Conventionally, there is known a plasma processing apparatus for performing plasma processing such as etching or the like on a target object such as a semiconductor wafer or the like by using plasma. In this plasma processing apparatus, a focus ring is provided at an outer peripheral portion of the target object in order to obtain plasma uniformity (see, e.g., Japanese Patent Application Publication No. 2010-232476).

In the plasma processing apparatus, when the plasma processing is performed on the target object, the focus ring is consumed. When the focus ring is consumed, a height of plasma sheath with respect to the target object is changed. Accordingly, processing characteristics such as an etching rate and the like are changed.

SUMMARY OF THE INVENTION

In accordance with an aspect, there is provided a plasma processing apparatus including a mounting table, a power supply unit and a power supply control unit. The mounting table has therein a coil provided along a mounting surface on which a focus ring is mounted. The power supply unit is configured to apply a high frequency voltage to the coil. The power supply control unit is configured to control the power supply unit to increase a power of the high frequency voltage applied to the coil in accordance with consumption of the focus ring.

In accordance with another aspect, there is provided a plasma control method including: measuring a degree of consumption of a focus ring provided on a mounting surface of a mounting table having therein a coil provided along the mounting surface; and controlling a power supply unit configured to apply a high frequency voltage to the coil to increase a power of the high frequency voltage applied to the coil in accordance with the measured degree of consumption of the focus ring.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
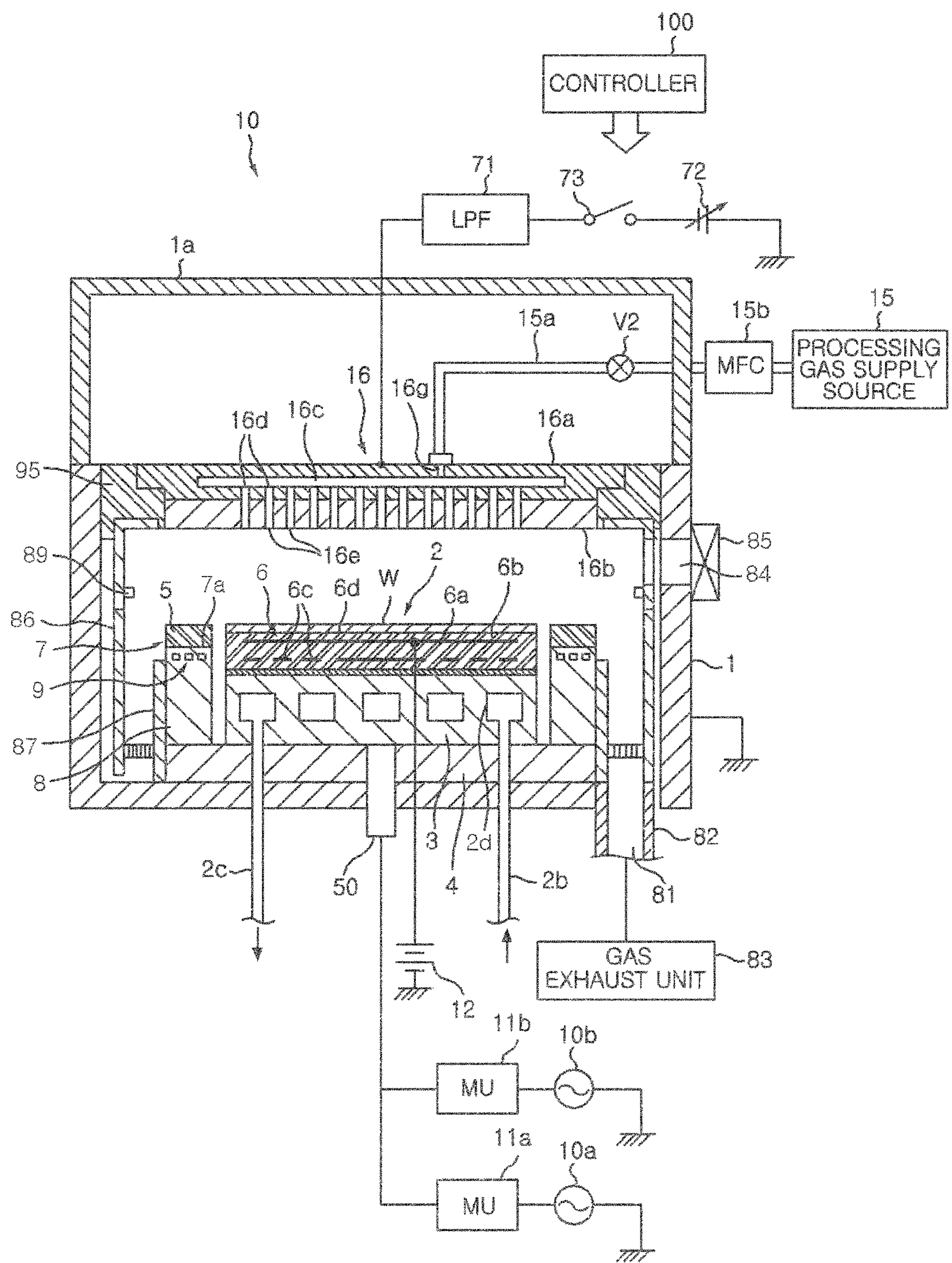
FIG. 1 is a schematic cross sectional view showing a schematic configuration of a plasma processing apparatus according to an embodiment.

Hereinafter, embodiments of a plasma processing apparatus, a plasma control method, and a plasma control program of the present disclosure will be described in detail with reference to the accompanying drawings. Like reference numerals will be given to like or corresponding parts throughout the drawings. The embodiments are not intended to limit the present disclosure. The embodiments can be appropriately combined without contradicting processing contents.

(Configuration of Plasma Processing Apparatus)

First, a schematic configuration of a plasma processing apparatus 10 according to an embodiment will be described. FIG. 1 is a schematic cross sectional view showing a schematic configuration of the plasma processing apparatus. The plasma processing apparatus 10 includes an airtight processing chamber 1 that is electrically grounded. The processing chamber 1 is formed in a cylindrical shape and made of, e.g., aluminum having an anodically oxidized surface or the like. The processing chamber 1 defines a processing space where plasma is generated. A first mounting table 2 for horizontally supporting a semiconductor wafer (hereinafter, simply referred to as "wafer") that is a target object is provided in the processing chamber 1.

The first mounting table 2 has a substantially cylindrical shape with an upper and a lower surface directed vertically. The upper surface of the first mounting table 2 serves as a mounting surface 6*d* on which the wafer W is mounted. The mounting surface 6*d* of the first mounting table 2 has a size that is substantially the same as that of the wafer W. The first mounting table 2 includes a base 3 and an electrostatic chuck 6.

The base 3 is made of metal, e.g., aluminum or the like. The base 3 serves as a lower electrode. The base 3 is supported by a supporting member 4 made of an insulator. The supporting member 4 is installed at a bottom portion of the processing chamber 1.

The electrostatic chuck 6 has a flat disc-shaped upper surface. The upper surface serves as the mounting surface 6*d* on which the wafer W is mounted. The electrostatic chuck 6 is provided at the center of the first mounting table 2 when seen from the top. The electrostatic chuck 6 includes an electrode 6*a* and an insulator 6*b*. The electrode 6*a* is embedded in the insulator 6*b*. A DC power supply 12 is connected to the electrode 6*a*. The wafer W is attracted and held on the electrostatic chuck 6 by a Coulomb force generated by applying a DC voltage from the DC power supply 12 to the electrode 6*a*. A heater 6*c* is provided in the insulator 6*b* of the electrostatic chuck 6. The heater 6*c* controls a temperature of the wafer W by a power supplied through a power supply unit to be described later.

A second mounting table 7 is provided around an outer periphery of the first mounting table 2. The second mounting table 7 is formed in a cylindrical shape whose inner diameter is greater than an outer diameter of the first mounting table 2 by a predetermined value. The first mounting table 2 and the second mounting table 7 are coaxially arranged about the same axis. The second mounting table 7 has an upper surface serving as a mounting surface 7*a* on which an annular focus ring 5 is provided. The focus ring 5 is made of, e.g., single crystal silicon, and is mounted on the second mounting table 7.

The second mounting table 7 includes a base 8. The base 8 is made of, e.g., aluminum having an anodically oxidized surface or the like. The base 8 is supported by the supporting member 4. The base 8 includes a coil 9. A specific configuration of the coil 9 will be described later.

A power feed rod 50 is connected to the base 3. The power feed rod 50 is connected to a first RF power supply 10*a* via a first matching unit (MU) 11*a* and connected to a second RF power supply 10*b* via a second matching unit (MU) 11*b*. The first RF power supply 10*a* generates power for plasma generation. A high frequency power having a predetermined frequency is supplied from the first RF power supply 10*a* to the base 3 of the first mounting table 2. The second RF power supply 10*b* generates power for ion attraction (bias). A high frequency power having a predetermined frequency lower than that from the first RF power supply 10*a* is supplied from the second RF power supply 10*b* to the base 3 of the first mounting table 2.

A coolant path 2*d* is formed in the base 3. The coolant path 2*d* has one end connected to a coolant inlet line 2*b* and the other end connected to a coolant outlet line 2*c*. The coolant path 2*d* is positioned below the wafer W and absorbs heat of the wafer W. The plasma etching apparatus 10 is configured to control a temperature of the first mounting table 2 by supplying and circulating a coolant, e.g., cooling water or the like, from a chiller unit (not shown) in the coolant path 2*d* through the coolant inlet line 2*b* and the coolant outlet line 2*c*. Further, the plasma etching apparatus 10 may be configured such that a cold heat transfer gas is supplied to a backside of the wafer W and to a bottom surface of the focus ring 35 to separately control the temperatures thereof. For example, a gas supply line for supplying a cold heat transfer gas (backside gas) such as He gas or the like to the backside of the wafer W may be provided to penetrate through the first mounting table 2 and the like. The gas supply line is connected to a gas supply source. With this configuration, the wafer W attracted and held on the electrostatic chuck 6 on the top surface of the first mounting table 2 can be controlled to a predetermined temperature.

A shower head 16 serving as an upper electrode is provided above the first mounting table 2 to face the first mounting table 31 2 in parallel therewith. The shower head 16 and the first mounting table 2 function as a pair of electrodes (upper electrode and lower electrode).

The shower head 16 is provided at a ceiling wall portion of the processing chamber 1. The shower head 16 includes a main body 16*a* and an upper ceiling plate 16*b* serving as an electrode plate. The shower head 16 is supported at an upper portion of the processing chamber 1 through an insulating member 95. The main body 16*a* is made of a conductive material, e.g., aluminum having an anodically oxidized surface. The upper ceiling plate 16*b* is detachably held at a bottom portion of the main body 16*a*.

A gas diffusion space 16*c* is formed in the main body 16*a*. A plurality of gas holes 16*d* is formed in the bottom portion of the main body 16*a* to be positioned below the gas diffusion space 16*c*. Gas injection holes 16*e* are formed through the upper ceiling plate 16*b* in a thickness direction thereof. The gas injection holes 16*e* communicate with the gas holes 16*d*. With this configuration, the processing gas supplied to the gas diffusion space 16*c* is distributed in a shower form into the processing chamber 1 through the gas holes 16*d* and the gas injection holes 16*e*.

A gas inlet port 16*g* for introducing the processing gas into the gas diffusion space 16*c* is formed in the main body 16*a*. One end of a gas supply line 15*a* is connected to the gas inlet port 16*g* and the other end of the gas supply line 15*a* is connected to a processing gas supply source 15 for supplying a processing gas. A mass flow controller (MFC) 15*b* and an opening/closing valve V2 are disposed in the gas supply line 15*a* in that order from an upstream side. The processing gas for plasma etching is supplied from the processing gas supply source 15 to the gas diffusion space 16*c* through the gas supply line 15*a* and distributed in a shower form into the processing chamber 1 through the gas holes 16*d* and the gas injection holes 16*e*.

A variable DC power supply 72 is electrically connected to the shower head 16 serving as the upper electrode via a low pass filter (LPF) 71. A power supply of the variable DC power supply 72 is on-off controlled by an on/off switch 73. Current/voltage of the variable DC power supply 72 and on/off of the on/off switch 73 are controlled by a controller 100 to be described later. When plasma is generated in the processing space by applying the high frequency power from the first and the second RF power supply 10*a* and 10*b* to the first mounting table 2, the on/off switch 73 is turned on and a predetermined DC voltage is applied to the shower head 16, if necessary.

A cylindrical ground conductor 1*a* extends upward from a sidewall of the processing chamber 1 to a position higher than a height of the shower head 16. The cylindrical ground conductor 1*a* has a ceiling wall at the top thereof.

A gas exhaust port 81 is formed at a bottom portion of the processing chamber 1. A gas exhaust unit 83 is connected to the gas exhaust port 81 through a gas exhaust line 82. The gas exhaust unit 83 has a vacuum pump. By operating the vacuum pump, a pressure in the processing chamber 1 can be decreased to a predetermined vacuum level. A loading/unloading port 84 for the wafer W is provided at a sidewall of the processing chamber 1. A gate valve 85 for opening/closing the loading/unloading port 84 is provided at the loading/unloading port 84.

A deposition shield 86 is provided along an inner surface of the sidewall of the processing chamber 1. The deposition shield 86 has a function of preventing etching by-products (deposits) from being attached to the inner surface of the sidewall of the processing chamber 1. A conductive member (GND block) 89 is provided at a portion of the deposition shield 86 at substantially the same height as the height of the wafer W. The conductive member 89 is connected such that a potential with respect to the ground can be controlled. Due to the presence of the conductive member 89, abnormal discharge is prevented. A deposition shield 87 extending along the first mounting table 2 is provided to correspond to a lower portion of the deposition shield 86. The deposition shields 86 and 87 are detachably provided.

The operation of the plasma etching apparatus 10 configured as described above is integrally controlled by the controller 100. The controller 100 is, e.g., a computer, and controls the respective components of the plasma etching apparatus 10.

(Configurations of the First Mounting Table And The Second Mounting Table)

Figure 2:
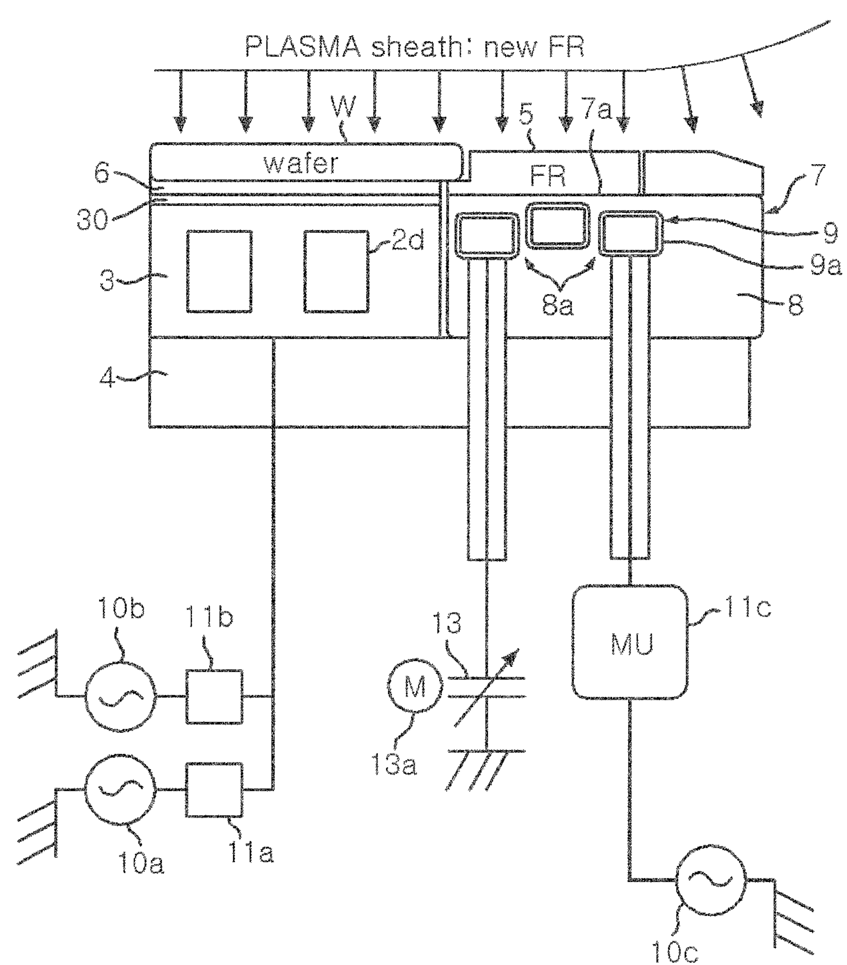
FIG. 2 is a schematic cross sectional view showing a configuration of main components of a first mounting table and a second mounting table.

Next, the configuration of main components of the first mounting table 2 and the second mounting table 7 will be described with reference to FIG. 2. FIG. 2 is a schematic cross sectional view showing the configuration of the main components of the first mounting table and the second mounting table.

The first mounting table 2 includes a base 3 and an electrostatic chuck 6. The electrostatic chuck 6 is adhered to the base 3 through an insulating layer 30. The electrostatic chuck 6 is formed in a disc shape and provided coaxially with respect to the base 3.

The second mounting table 7 includes a base 8. The upper surface of the second mounting table 7 serves as a mounting surface 7*a* on which the focus ring 5 is provided.

The focus ring 5 is an annular member and provided on the mounting surface 7*a* so as to be coaxial with the second mounting table 7.

Figure 3:
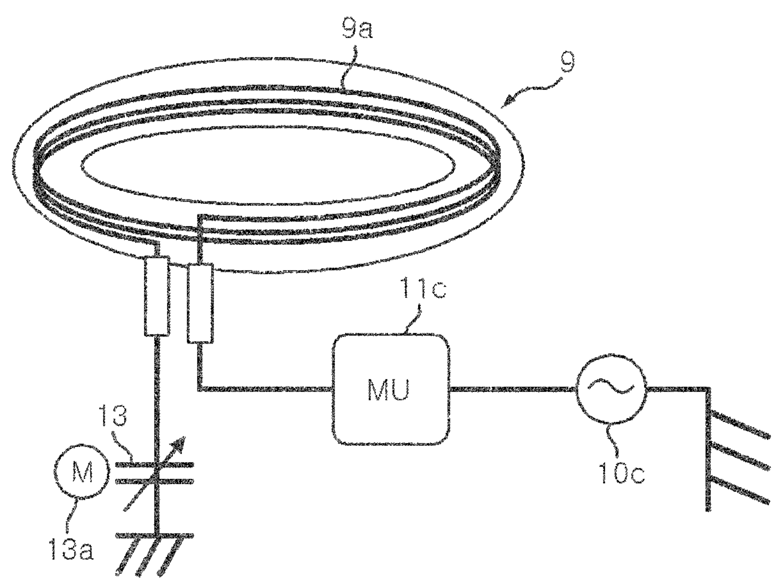
FIG. 3 shows a configuration of main components of a coil.

The base 8 has therein a coil 9 provided along the mounting surface 7*a*. At least a portion of the base 8 near the coil 9 is made of a dielectric material. The entire base 8 may be made of a dielectric material. The coil 9 is wound multiple times inside the base 8 along a circumferential direction of the base 8. FIG. 3 shows a configuration of main components of the coil. As shown in FIG. 3, for example, the coil 9 is wound three times inside the base 8.

As shown in FIG. 2, a wiring 9*a* forming the coil 9 has a rectangular cross section and has a hollow inner space. The hollow inner space of the wiring 9*a* serves as a flow path of a heating medium. For example, the wiring 9*a* is a hollow rectangular line, and a conductive film is formed on an outer surface thereof. A coolant, e.g., cooling water or the like, supplied from a chiller unit (not shown) can circulate through the wiring 9*a* forming the coil 9.

The coil 9 is arranged such that a diameter of the wiring 9*a* becomes gradually increased as the turn of the wiring 9*a* is increased and the wiring 9*a* of each turn is arranged along the mounting surface 7*a*. Further, the coil 9 is arranged such that a flat surface of the wiring 9*a* of each turn becomes in parallel with the mounting surface 7*a*.

As shown in FIG. 3, one end of the coil 9 is connected to a third RF power supply 10*c* via a third matching unit (MU) 11*c*. The other end of the coil 9 is connected to a variable capacitor 13. The variable capacitor 13 can change an electrostatic capacitance. For example, the variable capacitor 13 has a motor 13*a* provided at a rotation shaft, and the electrostatic capacitance can be changed by rotating the rotation shaft by the motor 13*a* under the control of the controller 100. The third RF power supply 10*c* is a power supply for plasma control in response to consumption of the focus ring 5. The third RF power supply 10*c* is configured to supply a high frequency power of a predetermined frequency to the coil 9. Further, the third RF power supply 10*c* can change the level of the high frequency power to be supplied under the control of the controller 100. The frequency of the high frequency power supplied by the third RF power supply 10*c* is set to a frequency that hardly resonates with the high frequency powers supplied from the first RF power supply 10*a* and the second RF power supply 10*b*. When the high frequency power is supplied from the third RF power supply 10*c*, the coil 9 functions as an ICP (Inductively Coupled Plasma) coil.

The coil 9 generates heat by the high frequency power from the third RF power supply 10*c*. The heat is released by circulating the coolant through the hollow inner space. Since the coil 9 is positioned below the focus ring 5, the coil 9 functions to absorb the heat of the focus ring 5 through the base 8. The plasma processing apparatus 10 is configured to control the temperature of the second mounting table 7 by circulating the coolant through the coolant path 2*d*.

In the coil 9, a dielectric portion forming the base 8 between the wirings 9*a* functions as an insulating layer 8*a*. Although it is expected that the plasma uniformity can be improved when an area of an upper flat portion of the wiring 9*a* is increased by decreasing a distance between the wiring 9*a*, it has a trade-off relation with a thickness of the insulating layer 8*a* between the wirings 9*a*. If the insulating layer 8*a* in the coil 9 is too thin, dielectric breakdown and abnormal discharge may occur. In the present embodiment, the thickness of the insulating layer 8*a* is set to, e.g., about 1 mm, so that the ratio of the area of the upper flat surface of the wiring 9*a* is increased when the coil 9 is viewed from the top.

(Configuration of the Controller)

Figure 4:
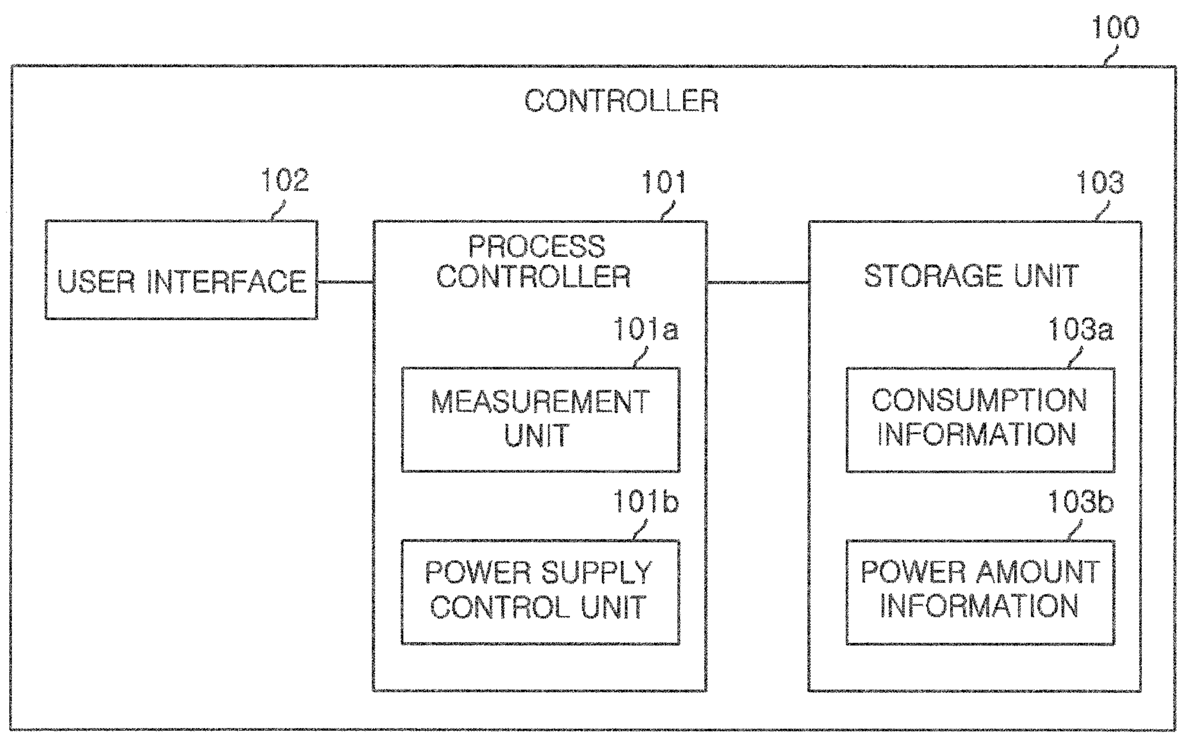
FIG. 4 is a block diagram showing a schematic configuration of a controller for controlling the plasma processing apparatus.

Next, the controller 100 will be described in detail. FIG. 4 is a block diagram showing a schematic configuration of the controller for controlling the plasma processing apparatus. The controller 100 includes a process controller 101, a user interface 102, and a storage unit 103.

The process controller 101 has a CPU (Central Processing Unit) and controls the respective components of the plasma processing apparatus 10.

The user interface 102 includes a keyboard through which a process manager inputs commands to manage the plasma processing apparatus 10, a display for visualizing an operational state of the plasma processing apparatus 10, and the like.

The storage unit 109 stores therein recipes including a control program (software), processing condition data and the like for realizing various processes performed by the plasma processing apparatus 10 under the control of the process controller 101. Further, the storage unit 103 stores therein various information for dealing with variation in processing characteristics which is caused by the consumption of the focus ring 5. For example, the storage unit 103 stores therein consumption information 103*a* indicating a degree of consumption of the focus ring 5 and power amount information 103*b* indicating the amount of high frequency power to be supplied to the coil 9. The control program and the recipes such as the processing condition data and the like can be stored in a computer-readable storage medium (e.g., a hard disk, an optical disk such as a DVD, a flexible disk, a semiconductor memory, or the like) or can be transmitted, when needed, from another apparatus through, e.g., a dedicated line, and used on-line.

The process controller 101 has an internal memory for storing programs or data. The process controller 101 reads out the control program stored in the storage unit 103 and executes processing of the read-out control program. The process controller 101 functions as various processing units by executing the control program. For example, the process controller 101 has functions of a measurement unit 101*a* and a power supply control unit 101*b*. In the plasma processing apparatus 10 of the present embodiment, the case in which the process controller 101 has the functions of the measurement unit 101*a* and the power supply control unit 101*b* will be described as an example. However, the functions of the measurement unit 101*a* and the power supply control unit 101*b* may be realized by a plurality of process controllers.

When the plasma processing such as plasma etching or the like is performed in the plasma processing apparatus 10, the focus ring 5 is consumed. In the plasma processing apparatus 10, when the focus ring 5 is consumed, a thickness of plasma sheath near the focus ring 5 is decreases and, thus, a height of the plasma sheath with respect to the wafer W is changed. Accordingly, the processing characteristics such as an etching rate and the like are changed.

In the plasma processing apparatus 10, various initial conditions are adjusted such that an etching rate and an etching shape of the wafer W become uniform in a state where the focus ring 5 is new. For example, FIG. 2 shows a state of plasma sheath in a state where the focus ring 5 is new. In the plasma processing apparatus 10, when the focus ring 5 is new, the height of the focus ring 5 or the level of the high frequency power supplied from the third RF power supply 10*c* to the coil 9 is adjusted such that the height of the plasma sheath with respect to the wafer W becomes uniform and the etching rate and the etching shape of the wafer W become uniform, as shown in FIG. 2.

However, in the plasma processing apparatus 10, as the plasma processing is repeated, the surface of the focus ring 5 is etched and the focus ring 5 is consumed. The degree of consumption of the focus ring 5 is increased as the number of execution of plasma processing or the processing time of plasma processing is increased. When the degree of consumption is significant, the focus ring 5 is replaced with a new one.

Figure 5:
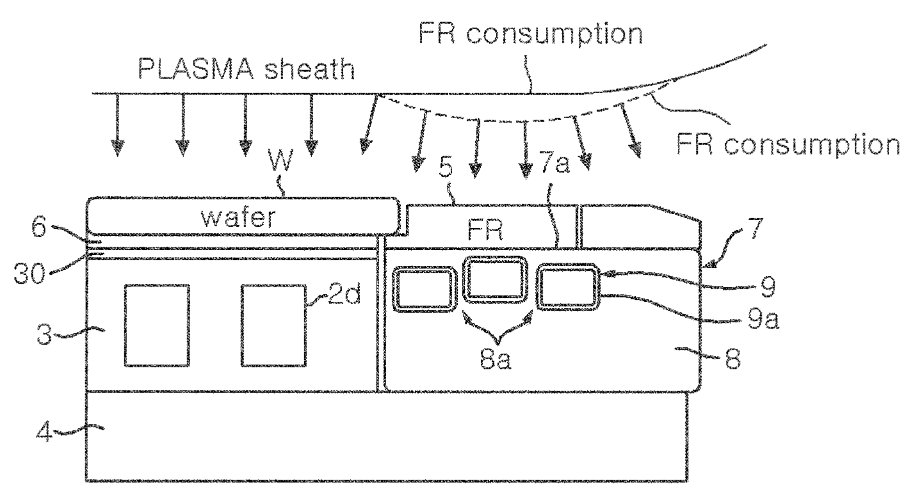
FIG. 5 shows an example of a state in which the focus ring is consumed.

FIG. 5 shows an example of a consumed state of the focus ring. In the example of FIG. 5, due to the etching of the surface of the focus ring 5, the thickness of the focus ring 5 is decreased and the height of the surface of the focus ring 5 with respect to the wafer W is decreased. When the height of the surface of the focus ring 5 with respect to the wafer W is decreased, the thickness of the plasma sheath near the focus ring 5 is decreased and, thus, the height of the plasma sheath near the upper portion of the focus ring 5 is decreased as indicated by a dashed line. When the height of the plasma sheath near the upper portion of the focus ring 5 is decreased, the processing characteristics such as an etching rate and an etching shape at an outer peripheral portion of the wafer W become different from those at a center portion of the wafer W in the plasma processing apparatus 10.

Therefore, the measurement unit 101*a* measures consumption of the focus ring 5. For example, the measurement unit 101*a* measures the number of execution of plasma processing or a cumulative processing time of plasma processing after the focus ring 5 is replaced with a new one. The measurement unit 101*a* stores the measured number of execution of plasma processing or the cumulative processing time of plasma processing in the consumption information 103*a* as information indicating a degree of consumption of the focus ring 5.

The power supply control unit 101*b* controls the third RF power supply 10*c* to increase the power of the high frequency voltage applied to the coil 9 in accordance with the degree of consumption of the focus ring 5. For example, the power supply control unit 101*b* controls the third RF power supply 10*c* to increase the power of the high frequency voltage applied to the coil 9 as the number of execution of plasma processing or the cumulative processing time of plasma processing which is measured by the measurement unit 101*a* is increased.

In the plasma processing apparatus 10, by increasing the power of the high frequency voltage supplied from the third RF power supply 10*c* to the coil 9, the potential of the focus ring 5 can be increased and the height of the plasma sheath near the upper portion of the focus ring 5 can be raised. For example, in the plasma processing apparatus 10, by appropriately increasing the power of the high frequency voltage supplied to the coil 9, the plasma sheath near the upper portion of the focus ring 5 can be increased, and the correction for raising the plasma sheath to a height indicated by a solid line can be performed. Accordingly, in the plasma processing apparatus 10, the variation in the processing characteristics can be suppressed.

For example, the power amount of the high frequency voltage applied to the coil 9 which suppresses variation in the processing characteristics is previously obtained for every execution of plasma processing or every cumulative processing time of plasma processing, and then stored in the power amount information 103*b*. Accordingly, the power amount of the high frequency voltage is stored in the power amount information 103*b* for every execution of plasma processing or every cumulative processing time of plasma processing such that the power of the high frequency voltage is increased as the number of execution of plasma processing or the cumulative processing time of plasma processing is increased.

The power supply control unit 101*b* reads out from the power amount information 103*b* the power amount of the high frequency voltage corresponding to the number of execution of plasma processing or the cumulative processing time of plasma processing which is measured by the measurement unit 110*a* at a predetermined timing (e.g., start timing) of the plasma processing for every wafer W and controls the third RF power supply 10*c* to supply the high frequency voltage of the read-out power amount.

Accordingly, in the plasma processing apparatus 10, the height of the plasma sheath near the upper portion of the focus ring 5 can be raised. As a result, the variation in the processing characteristics can be suppressed.

(Control Flow)

Figure 6:
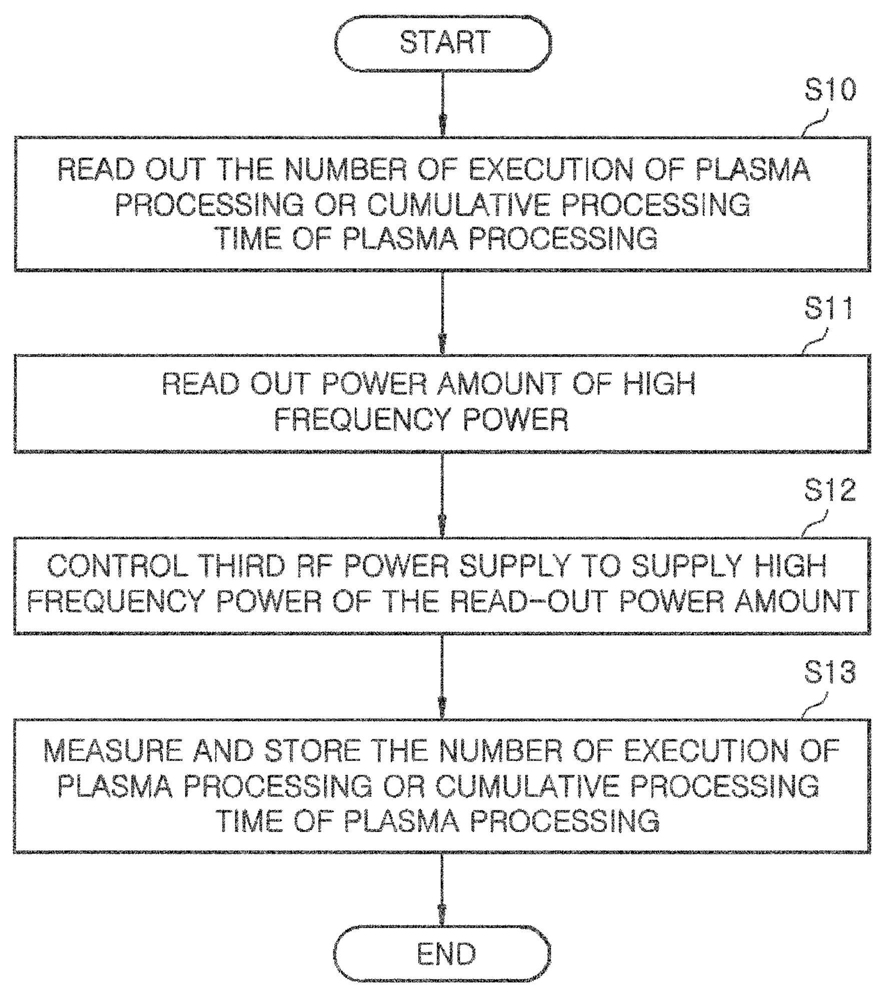
FIG. 6 is a flowchart showing an example of a plasma control process.

Next, a plasma control process using the plasma processing apparatus 10 of the present embodiment will be described. FIG. 6 is a flowchart showing an example of the plasma control process. This plasma control process is performed, e.g., at a predetermined timing of starting the plasma processing for every wafer W.

The power supply control unit 101*b* reads out the number of execution of plasma processing or the cumulative processing time of plasma processing which is stored in the consumption information 103*a* (step S10). The power supply control unit 101*b* reads out the power amount of the high frequency voltage corresponding to the read-out number of execution of plasma processing or the read-out cumulative processing time of plasma processing from the power amount information 103*b* (step S11). The power supply control unit 101*b* controls the third RF power supply 10*c* to supply the high frequency voltage of the read-out power amount (step S12).

The measurement unit 101*a* measures the number of execution of plasma processing or the cumulative processing time of plasma processing in the current plasma processing and stores the measurement result in the consumption information 103*a* (step S13). Then, the processing is completed.

(Effect)

The plasma processing apparatus 10 of the present embodiment includes the second mounting table 7, the third RF power supply 10*c*, and the power supply control unit 101*b*. The second mounting table 7 has therein a coil 9 provided along the mounting surface 7*a* on which the focus ring 5 is mounted. The third RF power supply 10*c* applies a high frequency voltage to the coil 9. The power supply control unit 101*b* controls the third RF power supply 10*c* to increase the power of the high frequency voltage applied to the coil 9 in accordance with a degree of consumption of the focus ring 5. Accordingly, the plasma processing apparatus 10 can suppress variation in the processing characteristics due to the consumption of the focus ring 5.

Further, in the plasma processing apparatus 10 of the present embodiment, a portion of the second mounting table 7 near the coil 9 is made of a dielectric material. Therefore, in the plasma processing apparatus 10, the high frequency power applied to the coil 9 can penetrate through the second mounting table 7 and the plasma sheath can be effectively increased.

Further, in the plasma processing apparatus 10 of the present embodiment, the coil 9 has a flat surface which faces the focus ring 5. In the plasma processing apparatus 10, the generation efficiency of the capacitively coupled plasma is improved by planarizing the portion of the coil 9 which faces the focus ring 5 and, thus, the uniformity of the plasma sheath can be improved with a small amount of high frequency power.

Moreover, in the plasma processing apparatus 10 of the present embodiment, the wiring 9*a* forming the coil 9 has a hollow inner space, and the hollow inner space of the wiring 9*a* serves as a flow path of the heat medium. Therefore, even when the coil 9 generates heat due to the application of the high frequency voltage, the plasma processing apparatus 10 can control the temperature by allowing the heat medium to flow through the hollow inner space of the wiring 9*a*. Further, the plasma processing apparatus 10 can control the temperature of the second mounting table 7 by allowing the heat medium to flow through the hollow inner space of the wiring 9*a*.

The plasma processing apparatus 10 of the present embodiment further includes the measurement unit 101*a*. The measurement unit 101*a* measures the number of execution of plasma processing or the cumulative processing time of plasma processing after the focus ring 5 is replaced with a new one. The power supply control unit 101*b* controls the third RF power supply 10*c* to increase the power of the high frequency voltage applied to the coil 9 as the measured number of execution of plasma processing or the measured cumulative processing time of plasma processing is increased. Accordingly, the plasma processing apparatus 10 can suppress variation in the processing characteristics due to the consumption of the focus ring 5.

While various embodiments have been described, the present disclosure is not limited thereto and various modifications can be made. For example, although the above-described plasma processing apparatus 10 is a capacitively coupled plasma processing apparatus 10, the first mounting table 2 may be employed for any plasma processing apparatus 10. For example, the plasma processing apparatus 10 may be any type of plasma processing apparatus 10, such as an inductively coupled plasma processing apparatus 10 or a plasma processing apparatus 10 for exciting a gas by a surface wave such as a microwave.

Further, in the present embodiment, there has been described the case in which the power amount of the high frequency voltage is stored in the power amount information 103*b* for every execution of plasma processing or every cumulative processing time of plasma processing and the power supply control unit 101*b* controls the third RF power supply 10*c* to increase the power of the high frequency voltage applied to the coil 9 based on the power amount information 103*b*. However, the present disclosure is not limited thereto. For example, it is also possible to previously obtain a calculation equation for calculating the power amount of the high frequency voltage applied to the coil 9 which suppresses variation in the processing characteristics for every execution of plasma processing or every cumulative processing time of plasma processing and, then, allow the power supply control unit 101*b* to control the third RF power supply 10*c* to increase the power amount of the high frequency voltage applied to the coil 9 based on the calculation equation. This calculation equation may be stored in the power amount information 103*b*.

Figure 7A:
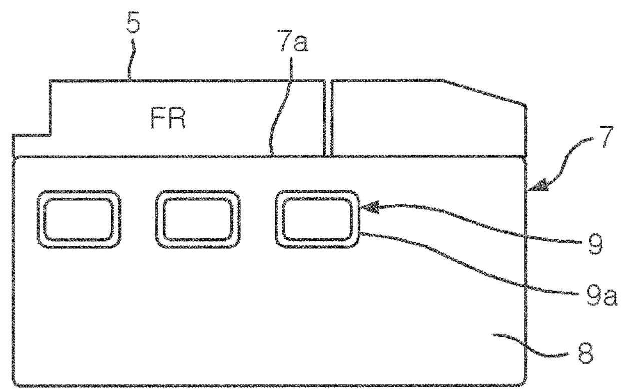
FIGS. 7A to 7C show examples of arrangement of a wiring forming the coil.
Figure 7B:
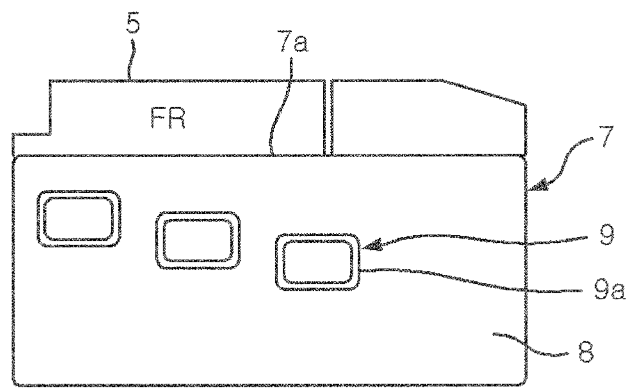
Figure 7C:
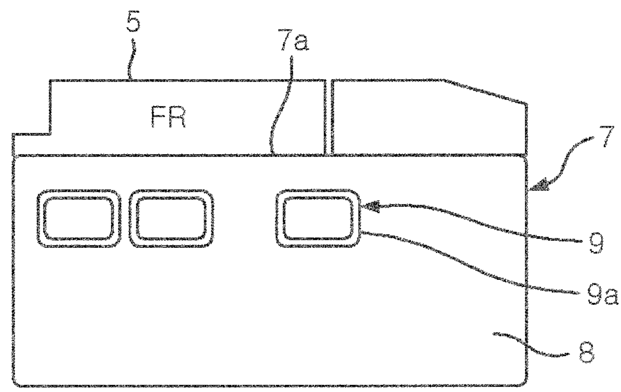

Further, in the plasma processing apparatus 10, the wiring 9*a* of the coil 9 may be arranged while changing the position of the wiring 9*a* of each turn or a gap between the wirings 9*a* in the radial direction of the base 8. FIG. 7A shows an example of arrangement of the wiring forming the coil. In the example of FIG. 7A, the wiring 9*a* of each turn is arranged uniformly at the same height in the circumferential direction of the base 8. FIG. 7B shows another example of arrangement of the wiring forming the coil. In the example of FIG. 7B, the wiring 9*a* of each turn is arranged higher at an inner side in the radial direction of the base 8. FIG. 7C shows still another example of arrangement of the wiring forming the coil. In the example of FIG. 7C, the gap between the wirings 9*a* is smaller to be dense at the inner side in the radial direction of the base 8. In the plasma processing apparatus 10, the consumption of the focus ring 5 is greater to make the plasma sheath thinner at the inner side in the radial direction. Therefore, by arranging the wiring 9*a* of the coil 9 as shown in FIGS. 7B and 7C, it is possible to increase the plasma sheath at the inner side in the radial direction which tends to be thinner.

Figure 8A:
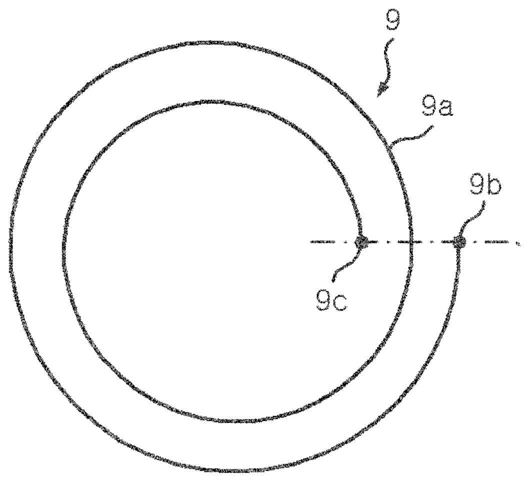
FIGS. 8A and 8B show an example of connection state of the coil.
Figure 8B:
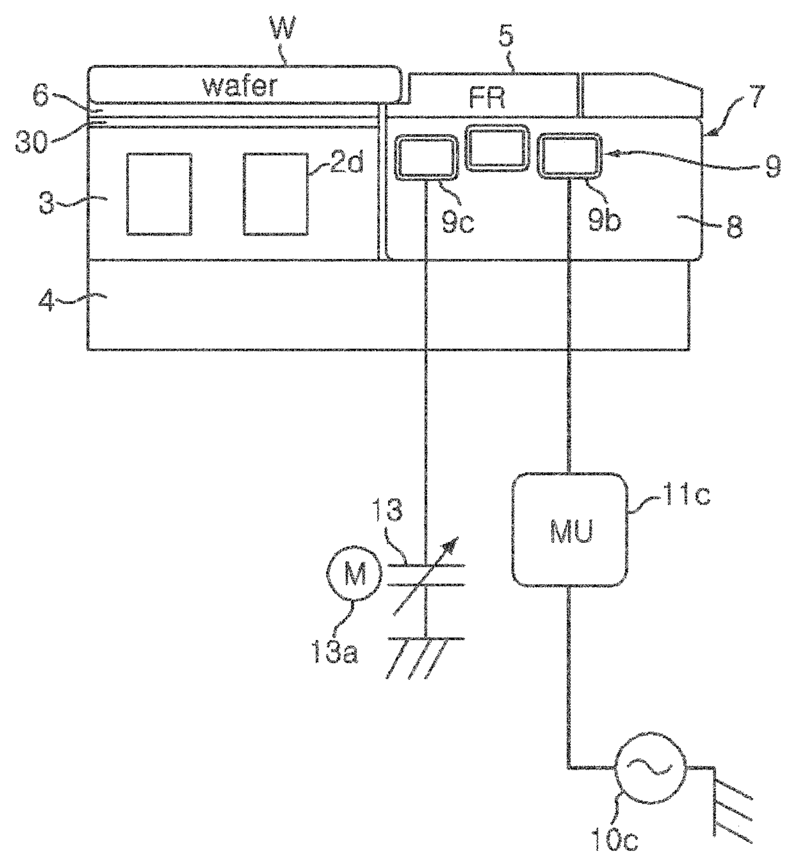
Figure 9A:
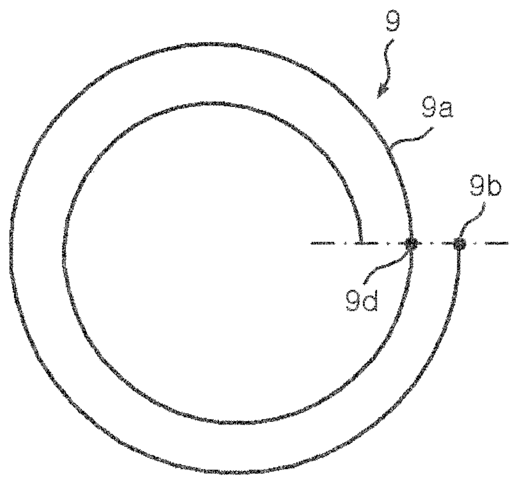
FIGS. 9A and 9B show another example of connection state of the coil.
Figure 9B:
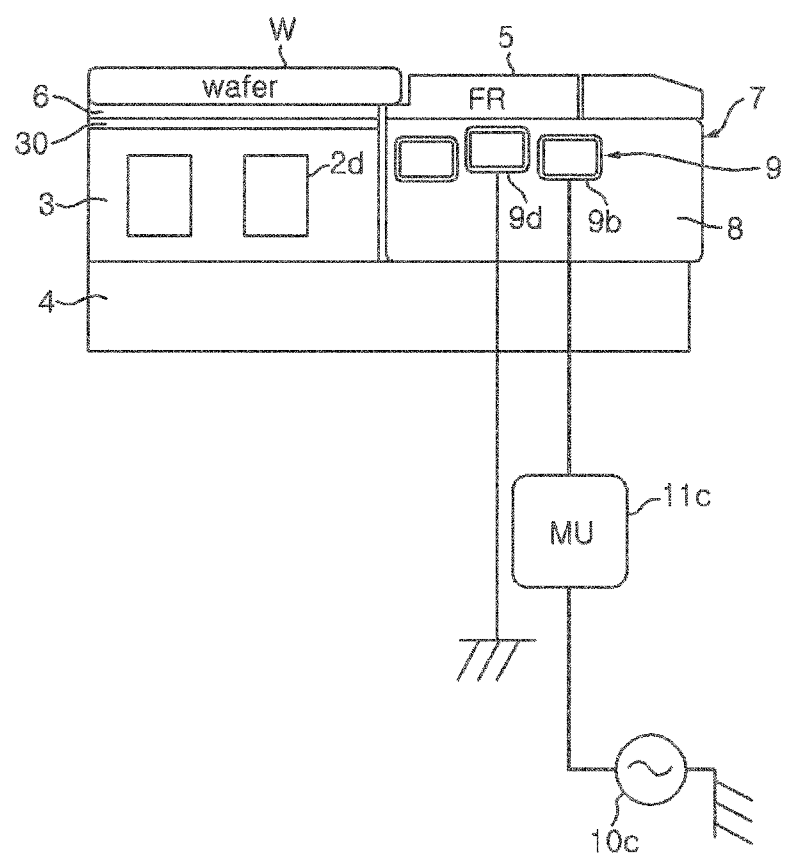
Figure 10A:
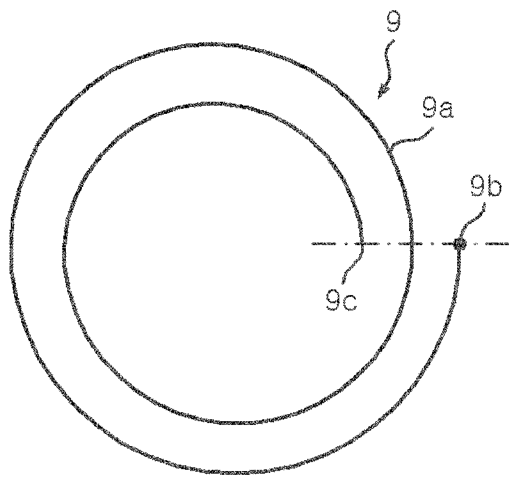
FIGS. 10A and 10B show still another example of connection state of the coil.
Figure 10B:
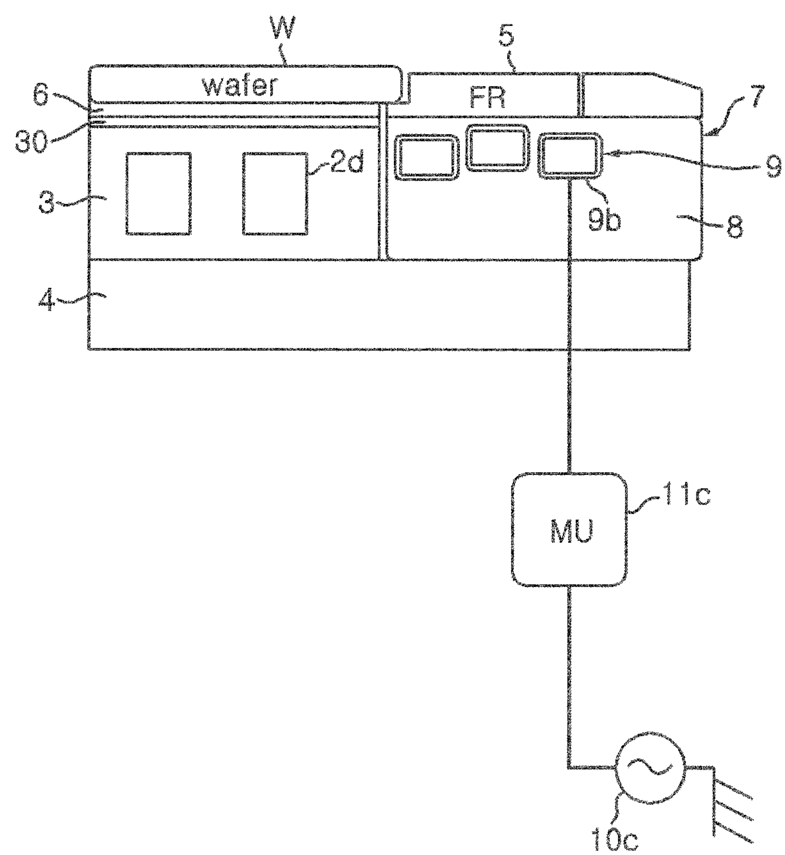

Further, in the present embodiment, there has been described the case in which one end of the coil 9 is connected to the third RF power supply 10*c* through the third matching unit 11*c* and the other end of the coil 9 is connected to the variable capacitor 13. FIGS. 8A and 8B show an example of a connection state of the coil. FIG. 8A shows the connection state of the coil. FIG. 8B shows the configuration of main components of the second mounting table. In the example of FIGS. 8A and 8B, one end 9*b* of the wiring 9*a* of the coil 9 is connected to the third RF power supply 10*c* through the third matching unit 11*c*, and the other end 9*c* of the coil 9 is connected to the variable capacitor 13. However, the present disclosure is not limited thereto. For example, one end of the coil 9 may be connected to the third RF power supply 10*c* through the third matching unit 11*c* and a position in the middle of the coil 9 which corresponds to a node of an amplitude of a high frequency wave may be grounded. FIGS. 9A and 9B showing another example of the connection state of the coil. FIG. 9A shows the connection state of the coil. FIG. 9B shows the configuration of main components of the second mounting table. In the examples of FIGS. 9A and 9B, one end 9*b* of the wiring 9*a* of the coil 9 is connected to the third RF power supply 10*c* through the third matching unit 11*c* and a position 9*d* of the coil 9 which corresponds to a node of an amplitude of a high frequency wave is grounded. For example, one end of the coil 9 may be connected to the third RF power supply 10*c* through the third matching unit 11*c* and the other end of the coil 9 may be opened. FIGS. 10A and 19B show still another example of the connection state of the coil. FIG. 10A shows the connection state of the coil. FIG. 10B shows the configuration of main components of the second mounting table. In the example of FIGS. 10A and 10B, one end 9*b* of the wiring 9*a* of the coil 9 is connected to the third RF power supply 10*c* through the third matching unit 11*c*, and the other end 9*c* of the coil 9 is opened.

The wiring 9*a* of the coil 9 may not have a conductive film on the entire outer surface thereof. For example, the wiring 9*a* of the coil 9 may have a conductive film only on the flat surface thereof facing the mounting surface 7*a*.

Figure 11A:
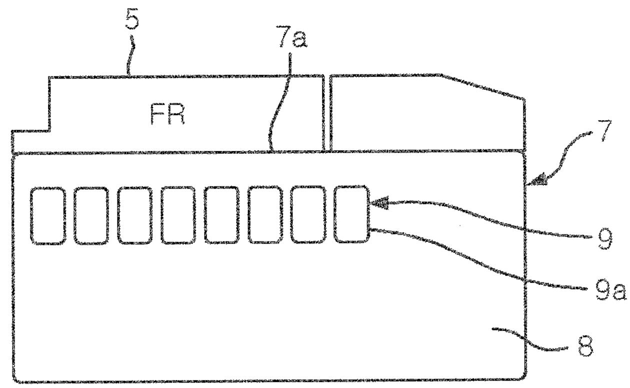
FIGS. 11A to 11C show examples of arrangement of a wiring forming the coil.
Figure 11B:
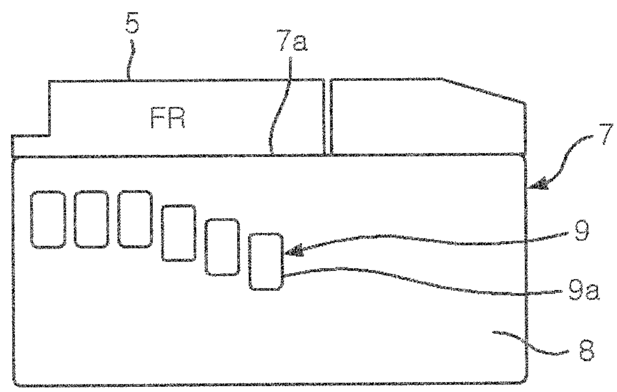
Figure 11C:
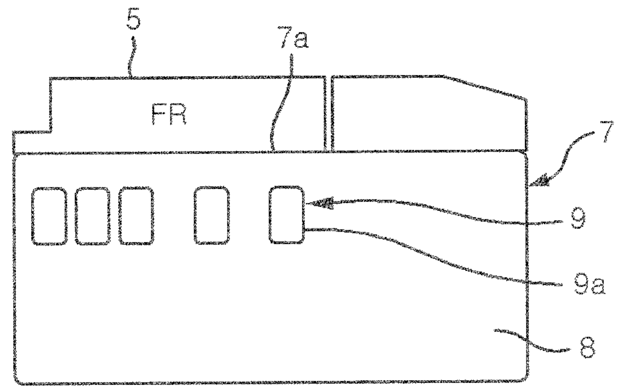

When the heat generation of the coil 9 is small and cooling is not required, the wiring 9*a* may not have a hollow inner space. FIG. 11A shows an example of arrangement of the wiring forming the coil. In the example of FIG. 11A, the wiring 9*a* forming the coil 9 does not have a hollow inner space and the entire wiring 9*a* is made of a conductive material. The wiring 9*a* of the coil 9 may be arranged while changing a position of the wiring 9*a* of each turn and a gap between the wirings 9*a* in the radial direction of the base 8. In the example of FIG. 11A, the wiring 9*a* of each turn is arranged uniformly at the same height in the radial direction of the base 8. FIG. 11B shows another example of arrangement of the wiring forming the coil. In the example of FIG. 11B, the wiring 9*a* of each turn is arranged higher at an inner side in the radial direction of the base 8. FIG. 11C shows still another example of arrangement of the wiring forming the coil. In the example of FIG. 11C, the gap between the wirings 9*a* is smaller to be dense at the inner side in the radial direction of the base 8.

In the plasma processing apparatus 10, a degree of consumption of the focus ring 5 may be measured by measuring a thickness of the focus ring with the measurement unit for measuring a thickness of the focus ring 5. For example, in the plasma processing apparatus 10, an optical interferometer for measuring a distance by interference of laser beam may be provided above the focus ring 5 or inside the second mounting table 7 in order to measure a thickness of the focus ring 5. Further, in the plasma processing apparatus 10, the power supply control unit 101*b* can control the third RF power supply 10*c* to increase the power of the high frequency voltage applied to the coil 9 as the measured thickness of the focus ring 5 becomes thinner. Accordingly, the plasma processing apparatus 10 can suppress variation in the processing characteristics due to the consumption of the focus ring 5.

Further, in the plasma processing apparatus 10, a degree of consumption of the focus ring 5 may be measured by measuring a voltage of the focus ring by the measurement unit for measuring a voltage (Vdc) of the focus ring 5. In the plasma processing apparatus 10, when the focus ring 5 is consumed, the sheath thickness becomes thin and the voltage of the focus ring 5 is decreased. Therefore, the plasma processing apparatus 10 may measure the voltage of the focus ring and control the third RF power supply 10*c* to increase the power of the high frequency voltage applied to the coil 9 as the measured voltage becomes lower. For example, the plasma processing apparatus 10 returns the sheath thickness by increasing the power of the high frequency voltage applied to the coil 9 to return the voltage of the focus ring to the original value before the consumption. Accordingly, the plasma processing apparatus 10 can suppress variation in the processing characteristics due to the consumption of the focus ring 5.

Figure 12A:
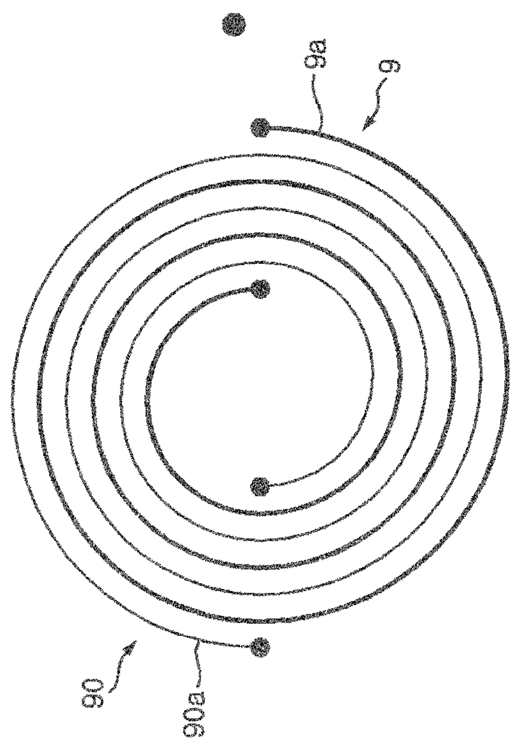
FIGS. 12A and 12B show an example of arrangement in the case of providing a temperature control heater.
Figure 12B:
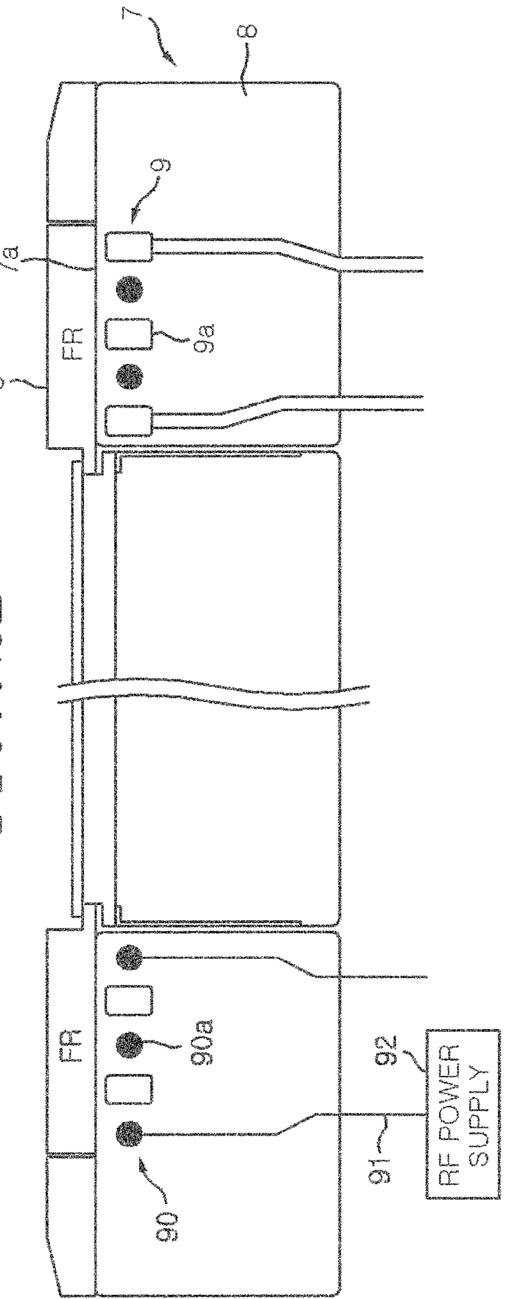

In the plasma processing apparatus 10, a heater for controlling a temperature of the focus ring 5 may be provided inside the second mounting table 7 in addition to the coil 9. FIGS. 12A and 12B show an example of arrangement in the case of providing a temperature control heater. The second mounting table 7 is provided with a coil 90 for induction heating, in addition to the coil 9. FIG. 12A is a top view showing the arrangement of the coil 9 and the coil 90. FIG. 12B is a cross sectional view of the second mounting table 7. In the example of FIGS. 12A and 12B, the wiring 9*a* of the coil 9 and the wiring 90*a* of the coil 90 are alternately arranged in parallel with the mounting surface 7*a*. In other words, the wiring of the coil 90 is positioned between the wirings of the coil 9. An RF power supply 92 for induction heating is connected to the coil 90 through a line 91, and a power of a relatively high frequency, e.g., several MHz to several hundreds of MHz, is supplied from the RF power supply 92. A power of a relatively low frequency, e.g., several hundreds of kHz to several MHz, is supplied from the third RF power supply 10*c* to the coil 9. Accordingly, the plasma processing apparatus 10 can perform both of the temperature control of the focus ring 5 and the adjustment of the height of the plasma sheath at the same time.

Figure 13A:
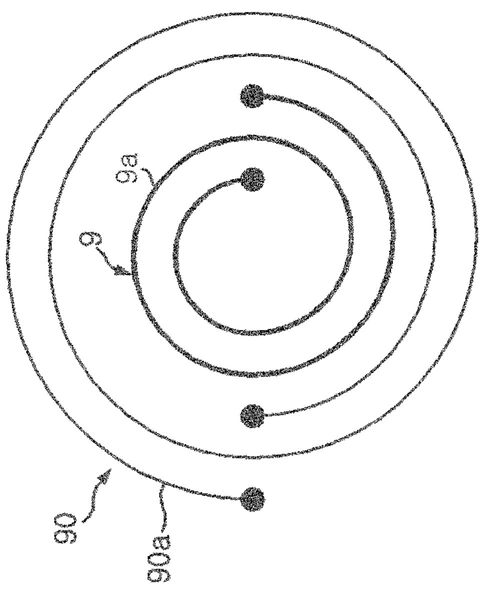
FIGS. 13A and 13B show an example of arrangement in the case of providing a temperature control heater.
Figure 13B:
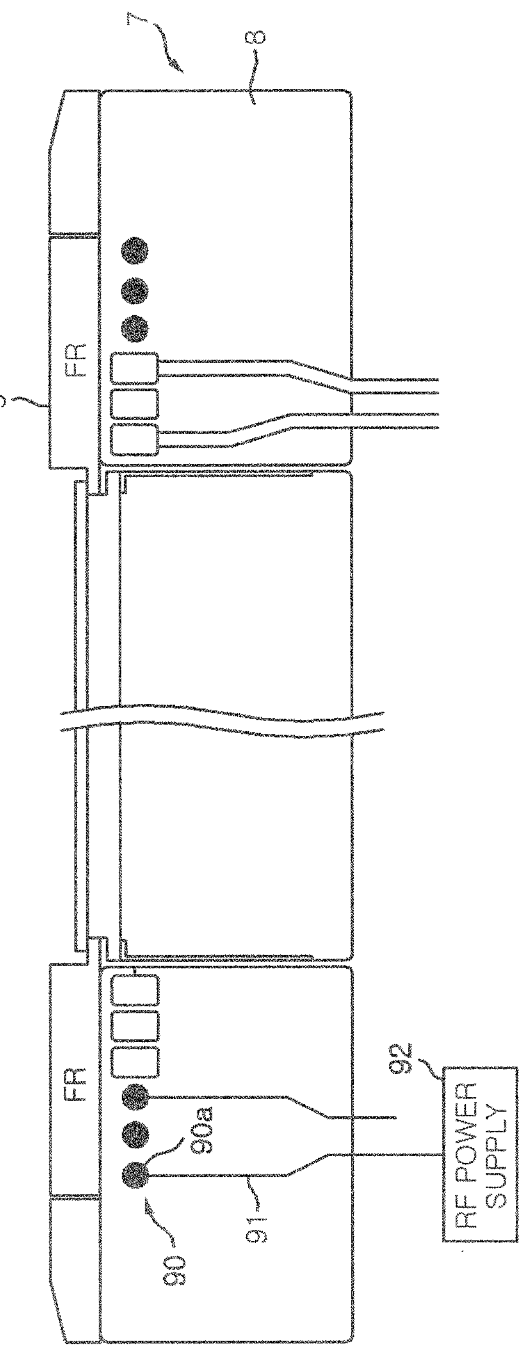

The coil 9 and the coil 90 may be arranged separately inside the second mounting table 7 depending on purposes. FIGS. 13A and 13B showing an example of arrangement in the case of providing a temperature control heater. FIG. 13B is a cross sectional view of the second mounting table 7. FIG. 13A is a top view showing the arrangement of the coil 9 and the coil 90. In the example of FIGS. 13A and 13B, in order to preferentially control the plasma sheath at the inner side of the focus ring 5 that is consumed faster, the coil 9 is disposed in parallel with the mounting surface 7*a* at an inner side of the mounting surface 7*a* and the coil 90 is disposed radially outward of the coil 9 in parallel with the mounting surface 7*a* at the inner side of the mounting surface 7*a*. Accordingly, the plasma processing apparatus 10 can control the plasma sheath at the inner side of the focus ring 5.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:

a mounting table having therein a coil provided along a mounting surface on which a focus ring is mounted;

a power supply unit configured to apply a high frequency voltage to the coil;

a measurement unit configured to obtain focus ring consumption information based on at least one of a number of plasma processes executed, a cumulative processing time of plasma processing, a measured thickness of the focus ring, or a measured voltage of the focus ring;

a memory configured to store power amount information for corresponding focus ring consumption information; and a power supply control unit configured to acquire, from the memory, power amount information corresponding to the focus ring consumption information obtained by the measurement unit, and to control an amount of power supplied by the power supply unit to the coil based on the acquired power amount information.

2. The plasma processing apparatus of claim 1, wherein a portion of the mounting table which is close to the coil is made of a dielectric material.

3. The plasma processing apparatus of claim 1, wherein the coil includes a flat surface which faces the focus ring.

4. The plasma processing apparatus of claim 1, wherein a wiring forming the coil has a hollow inner space.

5. The plasma processing apparatus of claim 4, wherein the hollow inner space of the wiring of the coil serves as a flow path of a heat medium.

6. The plasma processing apparatus of claim 1, wherein:
the measurement unit is configured to measure the thickness of the focus ring, and
the power supply control unit controls the power supply unit to increase the power of the high frequency voltage applied to the coil as the thickness of the focus ring which is measured by the measurement unit becomes thinner.

7. The plasma processing apparatus of claim 1, wherein:
the measurement unit is configured to measure the number of plasma processes executed or the cumulative processing time of the plasma processing after the focus ring is replaced with a new focus ring, and
the power supply control unit controls the power supply to increase the power of the high frequency voltage applied to the coil as the number of plasma processes executed or the cumulative processing time measured by the measurement unit is increased.

8. The plasma processing apparatus of claim 1, wherein:
the measurement unit is configured to measure the voltage of the focus ring, and
the power supply control unit controls the power supply unit to increase the power of the high frequency voltage applied to the coil as the voltage of the focus ring which is measured by the measurement unit becomes lower.

9. The plasma processing apparatus of claim 1, wherein the mounting table has therein a heater provided along the mounting surface.

10. The plasma processing apparatus according to claim 1, wherein the coil has a flat surface parallel to the mounting surface on which the focus ring is mounted.

11. The plasma processing apparatus according to claim 10, wherein the coil includes a wiring having a hollow inner space through which a coolant circulates.

12. The plasma processing apparatus according to claim 1, wherein the coil is provided peripherally around a substrate mounting portion, and the plasma processing apparatus further includes at least one further power supply which supplies RF power to the substrate mounting portion.

13. The plasma processing apparatus according to claim 1, wherein the mounting table is a second mounting table, the apparatus further including a first mounting table positioned radially inside of the second mounting table, wherein the coil is positioned within the second mounting table, wherein the first mounting table includes a substrate mounting surface upon which a substrate to be processed is mounted, and wherein the apparatus further includes at least one further power supply for supplying RF power to the first mounting table.

14. The plasma processing apparatus according to claim 1, wherein the power supply unit is a third power supply unit, and the apparatus further includes first and second power supply units which supply power to locations radially inside of the coil.

15. The plasma processing apparatus according to claim 1, wherein the power supply control unit is configured to increase the amount of power supplied to the coil as consumption of the focus ring increases as indicated by the focus ring consumption information.

16. A plasma control method comprising:
obtaining focus ring consumption information with a measurement unit which obtains consumption information based on determining a number of plasma processes executed, determining a cumulative processing time of plasma processing, measuring a thickness of the focus ring, or measuring a voltage of the focus ring, the focus ring consumption information indicating a degree of consumption of a focus ring provided on a mounting surface of a mounting table having therein a coil provided along the mounting surface;
acquiring, from a memory configured to store power amount information for corresponding focus ring consumption information, power amount information corresponding to the focus ring consumption information obtained in the obtaining step, by a power supply control unit; and
controlling a power supply unit configured to apply a high frequency voltage to the coil to control an amount of power of the high frequency voltage applied to the coil based on the power amount information acquired in the acquiring step, by the power supply control unit.

17. The method of claim 16, wherein the controlling of the power supply unit comprises controlling the power supply unit to increase the amount of power of the high frequency voltage as the degree of consumption of the focus ring increases as indicated by the focus ring consumption information obtained in the obtaining step.

* * * * *